United States Patent
Pavone et al.

(10) Patent No.: US 7,601,639 B2
(45) Date of Patent: Oct. 13, 2009

(54) METHOD FOR CONDITIONING A MICROELECTRONICS DEVICE DEPOSITION CHAMBER

(75) Inventors: Salvator F. Pavone, Murphy, TX (US); Jason J New, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 26 days.

(21) Appl. No.: 11/759,380

(22) Filed: Jun. 7, 2007

(65) Prior Publication Data

US 2007/0243316 A1 Oct. 18, 2007

Related U.S. Application Data

(62) Division of application No. 11/103,860, filed on Apr. 12, 2005, now Pat. No. 7,241,690.

(51) Int. Cl.
*H01L 21/44* (2006.01)

(52) U.S. Cl. .................. 438/679; 438/197; 438/903; 257/E21.054; 257/E21.174; 257/E21.293; 257/E21.632

(58) Field of Classification Search .............. 438/197, 438/679, 903, 723, 744, 756, 757, 758, 672, 438/675, 676, 677, 678
See application file for complete search history.

(56) References Cited

U.S. PATENT DOCUMENTS

| 4,563,367 | A |   | 1/1986  | Sherman |
|-----------|---|---|---------|---------|
| 4,681,653 | A | * | 7/1987  | Purdes et al. ............... 438/695 |
| 4,889,767 | A | * | 12/1989 | Yokoyama et al. .......... 428/336 |
| 5,017,403 | A | * | 5/1991  | Pang et al. ................... 427/576 |
| 6,326,597 | B1|   | 12/2001 | Lubomirsky et al. |
| 7,001,491 | B2|   | 2/2006  | Lombardi et al. |
| 7,241,690 | B2| * | 7/2007  | Pavone et al. ............... 438/679 |
| 2004/0061118 | A1 | | 4/2004 | Yamazaki et al. |

* cited by examiner

*Primary Examiner*—David Nhu
(74) *Attorney, Agent, or Firm*—Jacqueline J. Garner; Wade J. Brady, III; Frederick J. Telecky, Jr

(57) ABSTRACT

The present invention provides, in one aspect, the present invention provides, in one embodiment, a method of conditioning a deposition chamber 100. This method comprises placing an undercoat on the walls of a deposition chamber 100 and depositing a pre-deposition coat over the undercoat with a plasma gas mixture conducted at a high pressure and with high gas flow.

8 Claims, 3 Drawing Sheets

METHOD FOR CONDITIONING A MICROELECTRONICS DEVICE DEPOSITION CHAMBER

This is a divisional application of Ser. No. 11/103,860 filed Apr. 12, 2005 now U.S. Pat. No. 7,241,690.

TECHNICAL FIELD OF THE INVENTION

The present invention is directed in general to a pre-deposition conditioning method for a microelectronics device deposition chamber, and more specifically, to a method of removing residual liquefied gas within a supply line of a deposition tool that is used to fabricate a microelectronics device.

BACKGROUND

Microelectronic circuits have shrunk well into the sub-micron range, and their size continues to shrink even smaller with each passing generation of technology. As this miniaturization continues, each step of the manufacturing process becomes even more critical to assure as great a yield of defect-free devices as possible. Even the most initial and seemingly insignificant steps of the manufacturing process are important in assuring commercially feasible device yields.

One area that has grown in importance as device sizes have shrunk is the deposition chamber that is used to deposit the various layers that make up a microelectronics device. The industry has long since learned the importance of conditioning or seasoning the chamber prior to depositing a dielectric layer that is intended to isolate the various layers within the device from each other. The chamber is typically seasoned or conditioned by depositing a conditioning layer on the walls of the deposition chamber. It has been found that conditioning the deposition chamber provides for a more uniform wafer to wafer thickness control, as well as within wafer thickness uniformity, which is important in maintaining high device quality yields between individual wafers and wafer lots.

While design configurations vary from tool to tool, a deposition chamber will typically consist of six deposition stations within a main chamber. The wafer is inserted and is moved from station to station where sequential deposition takes place until the wafer has passed through all six stations. A shower head, from which deposition gases are dispensed, is located over each station. In the case of dielectric deposition, tetra-ortho silicate (TEOS) gas and oxygen gas are flowed under plasma conditions to form the dielectric layer. The TEOS is brought from a supply tank via a supply line as a liquid. Prior to being dispensed from a deposition shower head, however, the liquid TEOS is heated to turn it into a gas, which is then mixed with the oxygen and expelled from the shower head under plasma conditions to form the dielectric.

While every step is taken to reduce or eliminate the possibility of contaminate particles, contamination still occurs within the deposition chamber despite the best of efforts. Thus, to assure that contamination is not occurring within the deposition tool itself, the typical and present industry standard is to measure for particles on the wafer having a size of at least around 0.2 microns or greater. Until recently, this has seemed to be an adequate practice, but as devices sizes have continued to shrink deep into the sub-micron range, it has been noticed that defects are occurring in the devices at subsequent deposition steps, even though acceptable particle defectivity measurements are being obtained. It is believed that one reason for this is that as device sizes shrink, the metal density increases and any particle has a greater chance of causing a failure on the wafer. Thus, it is apparent that present pre-conditioning processes are not adequate to assure minimization of wafer to wafer particle defects.

Accordingly, what is needed in the art is a pre-conditioning process that will reduce particle defects in a wafer and can be implemented without substantial change in equipment or existing processing steps.

SUMMARY OF INVENTION

To address the above-discussed deficiencies of the prior art, the present invention provides, in one embodiment, a method of conditioning a deposition chamber. This method comprises placing an undercoat on the walls of a deposition chamber and depositing a pre-deposition coat over the undercoat with a plasma gas mixture conducted at a high pressure and with high gas flow.

In another embodiment, the present invention includes a method of fabricating an integrated circuit. In this embodiment, the method comprises forming transistors over a microelectronics substrate, conditioning a deposition chamber, comprising placing an undercoat on the walls of a deposition chamber and depositing a pre-deposition coat over the undercoat with a plasma gas mixture conducted at a high pressure and with high gas flow. Dielectric layers are deposited over the transistors and interconnects are formed within the dielectric layers to interconnect the transistors to form an operative integrated circuit.

In yet another embodiment, there is provided a method of depositing a layer over a microelectronics wafer. In this embodiment, the method comprises placing an undercoat on the walls of a deposition chamber, depositing a pre-deposition coat over the undercoat, placing a microelectronics wafer in the deposition chamber, and depositing a layer of material over a surface of the microelectronics wafer such that a particle defectivity of the layer of material is less than about 80 particle counts.

In another aspect, there is provided a method of conditioning a deposition chamber that comprises placing an undercoat on the walls of a deposition chamber, and removing a residual liquefied gas residing within a supply line connected to the deposition chamber subsequent to placing the undercoat and prior to depositing a layer of material onto a microelectronics wafer placed within the deposition chamber.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the heretofore unknown problem of residual liquefied gas residing in a supply line connected to a deposition chamber and the substantial particle reduction benefits associated with removing that residual liquefied gas prior to depositing a layer onto a microelectronics wafer.

Figure 1:
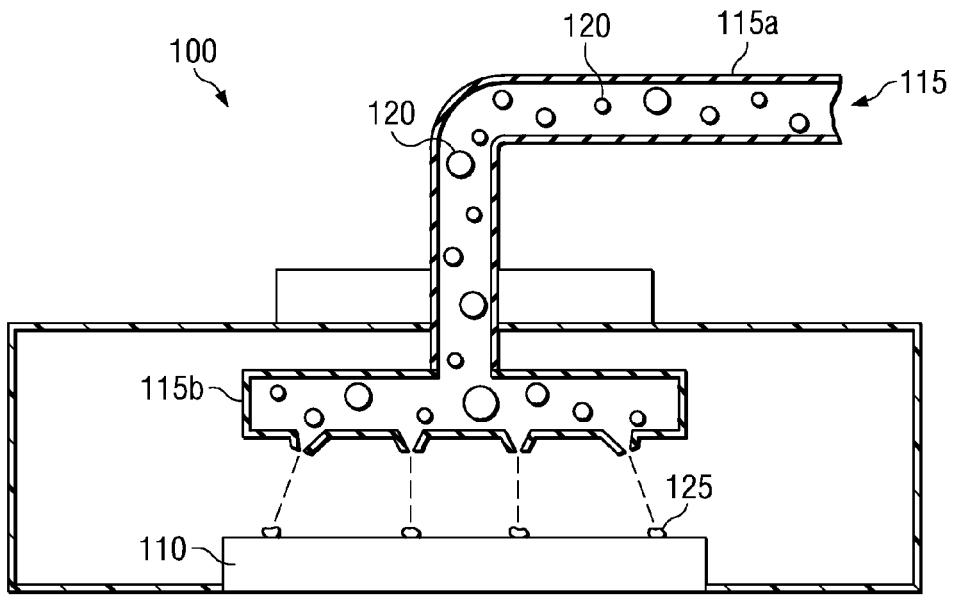
FIG. 1 illustrates a schematic, sectional view of a deposition chamber within a deposition.

Referring initially to FIG. 1, there is illustrated a schematic drawing of a deposition chamber 100 having a microelectronics wafer 110 located therein and an supply line 115 that is connected to and includes a line 115a and shower head 115b through which gas is dispensed in the deposition chamber 100 to form a deposition plasma. It should be understood that this figure is a simplified, highly schematic view of a deposition chamber that can be found in a conventional deposition tool and that the configuration of the deposition tool and chamber will vary from one manufacturer to another. Moreover, the scope of the present invention is not limited to any one type of deposition tool.

In most deposition processes, gases are used to form the various layers on the microelectronics wafer 110 from which microelectronics devices are made. These gases are stored, in some instances, as a liquid, and as they are transported to the deposition chamber, they are heated to form a gas and are often combined with other gases, such as oxygen, in a mixing chamber to form a gas mixture that is then injected into a plasma deposition chamber 100 and used to form a material layer on the microelectronics wafer 110.

With the present invention, it has been realized that, following a deposition process, the gas can condense and re-liquefy in the supply line 115a or the spray head 115b of the supply line 115 to form residual liquefied gas globules 120. These residual liquefied gas globules 120 can, in subsequent deposition processes, be deposited onto the microelectronics wafer 110 as small particles 125 (e.g., particles typically having a size in the 0.12 to 0.15 micron range). These small particles 125 have also been presently found to substantially increase the particles count across the entire microelectronics wafer 110. Because of the smaller device sizes and increased metal density in present day sub-micron devices, these smaller particles 125 can cause defects that have previously monitored.

Figure 2A:
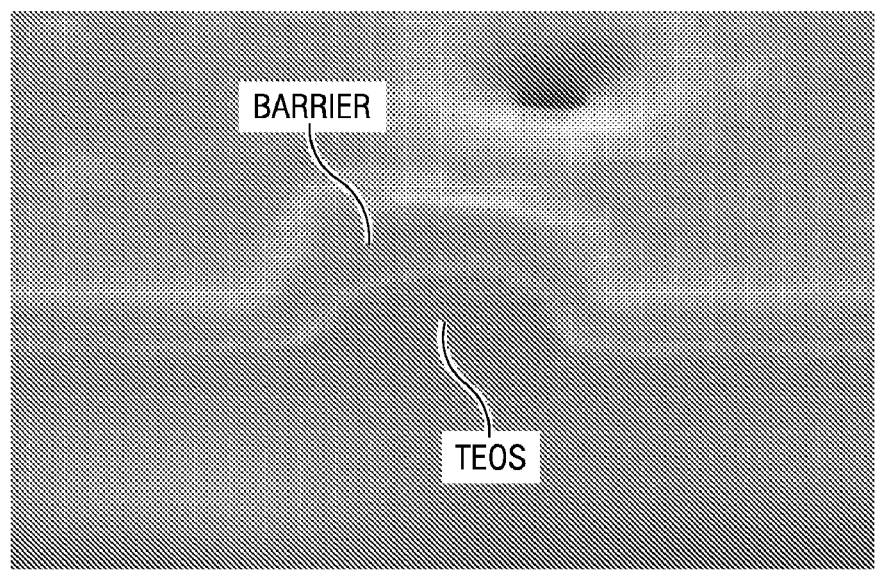
FIG. 2A is an electron microscope section view of a microelectronics device following the deposition of a contaminating TEOS particle.
Figure 2B:
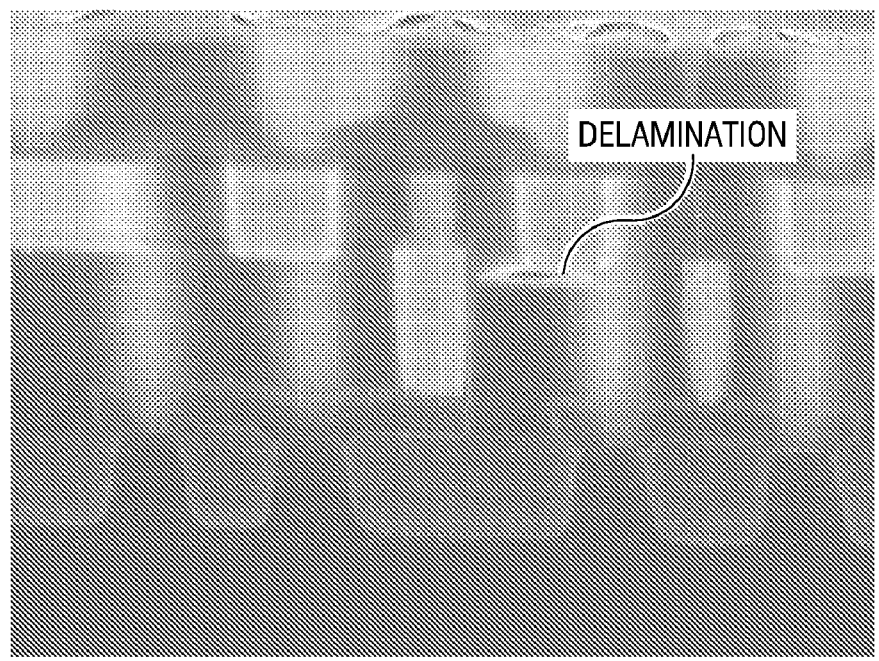
FIG. 2B illustrates another electron microscope section view of a microelectronics device showing how the TEOS particle can cause delamination within a the device.

FIGS. 2A and 2B are electron microscope sections illustrating the types of defects that the residual liquefied gas globules 120 can cause. FIG. 2A illustrates a sectional view of a globule of TEOS, which is emphasized by the presence of a barrier layer and that was deposited onto a microelectronics wafer without the benefit of the present invention. When present, the TEOS globule can cause layer delamination, as indicated in FIG. 2B. In addition, the TEOS globule can allow the titanium, which is present in the barrier layer, to migrate between contacts or interconnect structure, thereby causing shorts and device failure.

In the present invention these smaller TEOS particles were initially unnoticed because the particle defectivity of the particle scanning tool was set for the customary larger particles that typically have a size of about 0.2 microns. However, the smaller particles came to light after a discrepancy between chamber particle measurements and inline particle measurements was noted. The particle scanning tool was re-adjusted to measure a smaller particle size of about 0.12 microns or greater, and after this was done, the number of particle counts observed went up exponentially.

Following the realization of the presence of a large number of small particles on the microelectronics wafer, it was eventually discovered that the TEOS particles were attributable to the presence of residual liquefied TEOS in the supply line. Prior to this realization, a deposition chamber was conditioned with an undercoat of silane and a pre-coat of the material that was to be deposited, for example, TEOS, using a standard or conventional recipe to coat or condition the deposition chamber prior to the insertion of the wafer, and based on the large particle count at about the 0.12 micron size, the conventional pre-coat did not remove the residual liquefied gas.

To overcome the short comings of the conventional pre-residual liquefied gas within the supply line. One embodiment of the present invention provides a method of conditioning a deposition chamber. In this particular embodiment, an undercoat is deposited on the walls of a deposition chamber. The material used to form the undercoat may vary, but in an advantageous embodiment, the undercoat is a gas mixture containing silane. Preferably, the undercoat is deposited by plasma deposition. The gas mixture, likewise, may vary, but in addition to the silane gas, the mixture also preferably comprises nitrogen and nitrous oxide.

In an exemplary embodiment, the flow rate of the silane is about 500 sccm, the flow rate of nitrogen is about 1800 sccm, and the flow rate of nitrous oxide is about 18000 sccm. The flow rates of each of these gaseous components may vary, however, from those stated above. The plasma is preferably struck using a power of about 1300 watts, at a pressure of about 2.6 Torr, a temperature of about 400 degrees centigrade and is conducted for a period of time of about 330 seconds. While, the presence of the undercoat is not critical, its presence is preferred because it assures uniform wafer-to-wafer thickness.

This embodiment further includes the step of depositing a pre-deposition coat over the undercoat with a plasma gas mixture conducted at a high pressure and with high gas flow. In an exemplary embodiment, the high pressure ranges from about 3 Torr to about 5 Torr with about 4 Torr being generally preferred. The gas mixture is a preferably a mixture of TEOS gas, oxygen and a carrier gas, such as helium. The TEOS gas and oxygen are combined within a mixing chamber and then injected into the deposition chamber under plasma conditions to form a dielectric material, such as silicon dioxide. In this aspect of the present invention, the TEOS gas is generated from liquefied TEOS that has a flow rate that ranges from about 3.2 milliliters/minute to about 5 milliliters/minute with a preferred liquefied TEOS flow being about 4 liters/minute and at a chamber pressure of about 4 Torr. Those who are skilled in the art would know how to determine the gas flows of TEOS that would be generated from these flows of liquefied TEOS. The flow of the oxygen gas may range from about 8,000 sccm to about 30,000 sccm with a preferred flow of oxygen being about 19,000 sccm. It should be understood that other gases, which are capable of forming liquid condensate within a supply line of a deposition chamber are also within the scope of the present invention. It should be noted, however, that while both the high pressure and the high gas flow values may vary, the pressure and gas flow should be high enough to fully or substantially react the residual liquefied gas such that it does not create large particle counts on the wafer.

As mentioned above, the formation of the pre-deposition coat is achieved by using plasma. In one embodiment, the plasma is conducted at a power ranging from about 400 watts to about 1600 watts with about 1000 watts being preferred. The wattage may vary from those just stated above, but whatever wattage that is used must be sufficient to strike the plasma. The deposition may be conducted for a period of time ranging from about 30 seconds to about 1800 seconds, with about 300 second being a preferred time range. However, as those who are skilled in the art will realize, care should be taken so that the thickness of the pre-deposition coat does not become excessively thick such that it begins to flake off. The chamber temperature may range from about 150 degrees centigrade to about 500 degrees centigrade, with about 400 degrees centigrade being preferred.

Another aspect of the present invention provides a method of depositing a layer over a microelectronics wafer. In this particular embodiment, the method comprises placing an undercoat on the walls of a deposition chamber. The undercoat in this embodiment may be the same as the undercoat in the embodiment described above.

A pre-deposition coat is also deposited over the undercoat. However, the conditions by which the pre-deposition coat may be deposited can vary from the embodiment discussed above. For example, pressures and gas flows other than those stated in the ranges above are also within the scope of this embodiment. However, either one or both must be sufficient to substantially react the residual liquefied gas, such that the particle defectivity of a layer deposited on the microelectronic wafer is less than about 80 particle counts per wafer and more preferably, the particle count is less than about 30 particle counts per wafer wherein the particle size is about 0.12 microns or greater. In one aspect of this particular embodiment, however, the pre-deposition coat can be deposited using a plasma gas mixture conduced at a high pressure and with high gas flow as described above with respect to other embodiments.

The deposition of the pre-deposition coat causes residual liquefied gas residing within the supply line of the deposition chamber to be removed from the supply line, and in exemplary applications, the residual liquefied gas is the same gas that is used to form the layer on the microelectronics wafer.

From the foregoing descriptions, it can readily be seen that another aspect of the present invention provides an alternative method of conditioning. In this particular embodiment, however, the method comprises placing an undercoat on the walls of a deposition chamber, as described above regarding other embodiments, and removing a residual liquefied gas residing within a supply line of a deposition chamber. The removing is conducted subsequent to placing the undercoat but prior to depositing a layer of material onto a microelectronics wafer. In an advantageous embodiment, the pre-deposition coat may be deposited with a plasma gas mixture conducted at a high pressure and with high gas flow, including those embodiments, as previously described above. Because the residual liquefied gas is substantially removed, significantly lower particle counts per wafer can be achieved as discussed herein.

Figure 3:
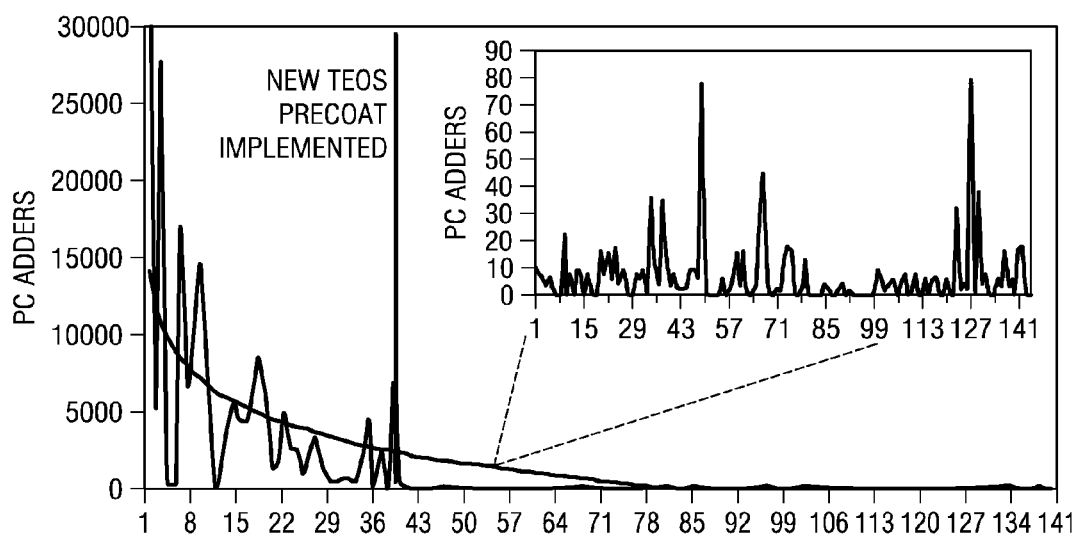
FIG. 3 illustrates a graph of particle counts prior to and subsequent to implementation of the present invention.

The various embodiments as provided by the present invention provide for a considerably reduced particle account per wafer. To illustrate this further, attention is now directed to FIG. 3, which is a graph showing particle counts before implementation of the present invention and particle counts after implementation of an embodiment of the present invention. The inset graph is an enlargement of the data after implementation of the present invention. The enlargement was necessary because the scale changed so substantially that the detail could not be discerned without the enlargement. As seen from FIG. 3, particle counts per wafer having a size of about 0.12 microns or greater ranged from about 30,000 particle counts per wafer to about 5,000 particle counts per wafer prior to employment of the present invention. However, after implementation of the present invention, and as reflected by the insert graph, the particle counts in the same size range dropped to about 80 particle counts per wafer or less and actually averaged well below about 30 particle counts per wafer. This dramatic drop in particle counts was highly unexpected and reflects a significant benefit provided by the present invention.

Figure 4:
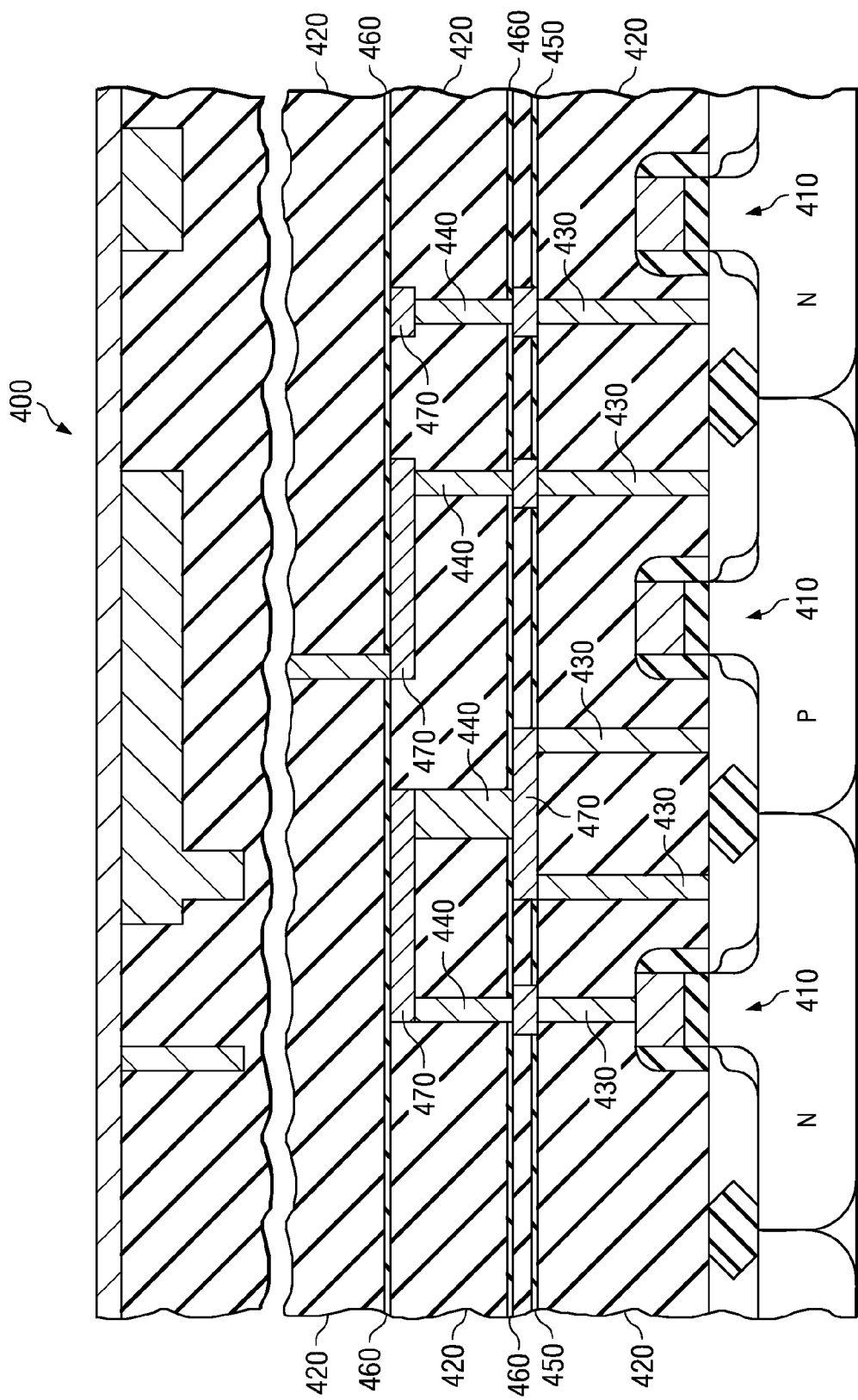
FIG. 4 illustrates a partial sectional view of a multi-layered integrated circuit that can be fabricated according to the principles of the present invention.

By way of further illustration of an advantageous embodiment provided by the present invention, attention is now directed to FIG. 4, which is a sectional view of an integrated circuit (IC) 400 incorporating semiconductor devices 410, interconnected with contacts 430, vias 440, and metal traces 470. The vias and metal traces are embedded in conventionally deposited dielectric 420, which may be single or multi-layered, using one or more dielectric materials, which may be low-k or ultra low-k dielectrics. Diffusion barrier 460 overlies dielectric 420 and metal lines, and may comprise conventionally deposited silicon nitride, silicon carbide, or other suitable dielectric material.

All of the materials used to construct the integrated circuit 400 are formed using conventional depositional processes. As such, the depositional chamber conditioning method as covered by the present invention would be extremely beneficial in reducing particle counts on any layer within the integrated circuit, including the dielectric 420. Thus, at least one level of the dielectric 420, as well as other layers has been processed according to at least one of the embodiments of the present invention, as discussed above. The IC 400 may include devices, such as transistors used to form CMOS devices, BiCMOS devices, bipolar devices, capacitors or other types of devices.

The IC 400 may further include passive devices, such as inductors or resistors, or it may also include optical devices or optoelectronic devices. Those skilled in the art are familiar with these various types of devices and their manufacture. Metal traces 470 and vias 430 are used to connect the various devices to form the operational IC 400. The interconnect architecture of the IC 400 is exemplary of one that may be fabricated according to the principles of the invention. It will be apparent to one skilled in the art that several variations of the exemplary interconnect architecture may be fabricated according to the principles of the invention with similarly advantageous results.

Thus, as can see from the foregoing discussion, the present invention provides methods of conditioning a deposition chamber such that particle counts are extensively reduced, thereby increasing device yields. Moreover, this can be done without re-tooling or shutting the line done to perform lengthy cleaning operations on the tool. Thus, production economy can easily be maintained and at the same time, production yields can be dramatically increased due to the significant lowering of particle counts on production wafers.

Although the present invention has been described in detail, one who is of ordinary skill in the art should understand that they can make various changes, substitutions, and alterations herein without departing from the scope of the invention.

What is claimed is:

1. A method of depositing a layer over a microelectronics wafer, comprising:
   placing an undercoat on walls of a deposition chamber; and
   depositing a pre-deposition coat over the undercoat;
   placing a microelectronics wafer in the deposition chamber; and
   depositing a layer of material over a surface of the microelectronics wafer such that a particle defectivity of the layer of material is less than about 80 particle counts per wafer.

2. The method of depositing a layer over a microelectronics wafer according to claim 1, wherein the particle defectivity associated with the microelectronics wafer is less than about 30 particle counts, wherein a particle size is about 0.12 microns or greater.

3. The method of depositing a layer over a microelectronics wafer according to claim 1, wherein depositing the pre-deposition coat comprises depositing the pre-deposition coat with a plasma gas mixture conducted at a high pressure and with high gas flow.

4. The method of depositing a layer over a microelectronics wafer according to claim 3, wherein depositing the pre-deposition coat causes residual liquefied gas residing within a supply line connected to the deposition chamber to be removed from the supply line and wherein the supply gas is used to form the layer of material.

5. A method of conditioning a deposition chamber, comprising:
   placing an undercoat on the walls of a deposition chamber; and
   removing a residual liquefied supply gas residing within a supply line connected to the deposition chamber subsequent to placing the undercoat and prior to depositing a layer of material onto a microelectronics wafer placed within the deposition chamber.

6. The method of conditioning a deposition chamber as in claim 5, wherein removing comprises depositing a pre-deposition coat over the undercoat with a plasma gas mixture conducted at a high pressure and with high gas flow.

7. The method of conditioning a deposition chamber as in claim 6, wherein the high pressure ranges from about 3 Torr to about 5 Torr and the plasm gas mixture is a mixture of tetraortho silicate (TEOS) gas and oxygen, wherein the TEOS gas is generated from liquefied TEOS that has a flow rate that ranges from about 3.2 milliliters/minute to about 5 milliliters/minute and a flow of the oxygen ranges from about 8,000 sccm to about 30,000 sccm.

8. The method of conditioning a deposition chamber as in claim 5, wherein the residual liquefied supply gas is used to form the layer of material and a particle defectivity of the layer of material is less than about 80 particle counts, wherein a particle size is about 0.12 microns or greater.

* * * * *